US007956793B2

(12) United States Patent
Puscasu et al.

(10) Patent No.: US 7,956,793 B2
(45) Date of Patent: Jun. 7, 2011

(54) SELECTIVE REFLECTIVE AND ABSORPTIVE SURFACES AND METHODS FOR RESONANTLY COUPLING INCIDENT RADIATION

(75) Inventors: Irina Puscasu, Somerville, MA (US); William Schaich, Bloomington, IN (US)

(73) Assignee: ICX Technologies, Inc., Arlington, VA (US)

(*) Notice: Subject to any disclaimer, the term of this patent is extended or adjusted under 35 U.S.C. 154(b) by 745 days.

(21) Appl. No.: 11/638,043

(22) Filed: Dec. 12, 2006

(65) Prior Publication Data

US 2007/0222658 A1 Sep. 27, 2007

Related U.S. Application Data

(60) Provisional application No. 60/749,511, filed on Dec. 12, 2005.

(51) Int. Cl.

*H01Q 17/00* (2006.01)
*G01S 13/00* (2006.01)
*H05K 9/00* (2006.01)

(52) U.S. Cl. ................................................ 342/4; 342/1

(58) Field of Classification Search ................ 342/1–20, 342/175; 257/499, 528, 532–535, 595, 598, 257/68; 438/104; 428/544, 615, 621, 624–627; 359/237, 238, 290, 291–295; 156/229; 361/271, 361/301.1, 303, 306.1–310, 328–330, 500, 361/523, 524; 343/700 MS See application file for complete search history.

(56) References Cited

U.S. PATENT DOCUMENTS

| | | | | |
|---|---|---|---|---|
| 2,992,425 | A * | 7/1961 | Pratt | 342/1 |
| 3,139,568 | A * | 6/1964 | Ishikawa et al. | 361/524 |
| 3,284,685 | A * | 11/1966 | Rieth | 361/303 |
| 3,540,047 | A * | 11/1970 | Hach et al. | 342/1 |

(Continued)

FOREIGN PATENT DOCUMENTS

EP 1720396 A 11/2006

(Continued)

OTHER PUBLICATIONS

Puscasu, et al., "Near-infrared transmission and emission characteristics of frequency selective surfaces and its nano-fabrication issues", Conference on Lasers and Electro-optics (CLEO 2001), Technical Digest, Postconference Edition, Baltimore, MD, May 6-11, 2001, Trends in Optics and Photonics (TOPS), US Washington, WA: OSA, US, vol. 56, May 6, 2001, pp. 212-212, XP010559748, ISBN: 978-1-55752-662-5.

(Continued)

*Primary Examiner* — Bernarr E Gregory
(74) *Attorney, Agent, or Firm* — Foley & Lardner LLP

(57) ABSTRACT

Methods and apparatus for providing a tunable absorption band in a wavelength selective surface are disclosed. A device for selectively absorbing incident electromagnetic radiation includes an electrically conductive surface layer including an arrangement of multiple surface elements. The surface layer is disposed at a nonzero height above a continuous electrically conductive layer. An electrically isolating intermediate layer defines a first surface that is in communication with the electrically conductive surface layer. The continuous electrically conductive backing layer is provided in communication with a second surface of the electrically isolating intermediate layer. The arrangement of surface elements couples at least a portion of the incident electromagnetic radiation between itself and the continuous electrically conductive backing layer, such that the resonant device selectively absorbs incident radiation, and reflects a portion of the incident radiation that is not absorbed.

25 Claims, 7 Drawing Sheets

U.S. PATENT DOCUMENTS

| | | | | |
|---|---|---|---|---|
| 3,733,606 | A * | 5/1973 | Johansson | 342/3 |
| 3,887,920 | A * | 6/1975 | Wright et al. | 342/1 |
| 4,456,917 | A * | 6/1984 | Sato et al. | 257/598 |
| 4,522,890 | A * | 6/1985 | Volkers et al. | 428/624 |
| 4,949,217 | A * | 8/1990 | Ngo | 361/328 |
| 5,627,541 | A | 5/1997 | Haley et al. | |
| 5,710,564 | A | 1/1998 | Nimtz et al. | |
| 6,072,687 | A * | 6/2000 | Naito et al. | 361/303 |
| 6,215,647 | B1 * | 4/2001 | Naito et al. | 361/303 |
| 6,266,228 | B1 * | 7/2001 | Naito et al. | 361/306.1 |
| 6,266,229 | B1 * | 7/2001 | Naito et al. | 361/306.3 |
| 6,292,350 | B1 * | 9/2001 | Naito et al. | 361/306.3 |
| 6,323,057 | B1 * | 11/2001 | Sone | 438/104 |
| 6,351,369 | B1 * | 2/2002 | Kuroda et al. | 361/306.3 |
| 6,359,581 | B2 | 3/2002 | Kurihara et al. | |
| 6,407,904 | B1 * | 6/2002 | Kuroda et al. | 361/303 |
| 6,430,025 | B2 * | 8/2002 | Naito et al. | 361/303 |
| 6,433,993 | B1 * | 8/2002 | Hunt et al. | 361/303 |
| 6,441,771 | B1 * | 8/2002 | Victora | 342/1 |
| 6,538,596 | B1 * | 3/2003 | Gilbert | 342/1 |
| 6,774,866 | B2 * | 8/2004 | McKinzie et al. | 343/700 MS |
| 6,794,729 | B2 * | 9/2004 | Mori et al. | 257/532 |
| 6,819,543 | B2 * | 11/2004 | Vieweg et al. | 361/306.3 |
| 2001/0038353 | A1 | 11/2001 | Toyoda et al. | |
| 2002/0088977 | A1 * | 7/2002 | Mori et al. | 257/68 |
| 2004/0021597 | A1 | 2/2004 | Dvorak et al. | |
| 2004/0257260 | A1 | 12/2004 | Breeden et al. | |

FOREIGN PATENT DOCUMENTS

| | | | |
|---|---|---|---|
| GB | 814310 | A | 6/1959 |
| JP | 2002/314284 | A | 10/2002 |
| WO | WO 2004/093244 | A | 10/2004 |
| WO | WO 2005/084097 | A | 9/2005 |

OTHER PUBLICATIONS

EPO Search Report—(EP 06 851527) Date of Completion of the Search Nov. 28, 2008.

Internationl Search Report (PCT/US06/47449); Date of Mailing: Jan. 31, 3008; 1 page.

* cited by examiner

SELECTIVE REFLECTIVE AND ABSORPTIVE SURFACES AND METHODS FOR RESONANTLY COUPLING INCIDENT RADIATION

RELATED APPLICATIONS

This application is claims the benefit of priority under 35 U.S.C. §119 from U.S. Provisional Application Ser. No. 60/749,511, filed on Dec. 12, 2005, the contents of which are incorporated herein by reference in their entirety.

STATEMENT REGARDING FEDERALLY SPONSORED RESEARCH OR DEVELOPMENT

This invention was made with Government support under DMI-0319284 awarded by the National Science Foundation. The Government has certain rights in this invention.

FIELD OF THE INVENTION

The present invention relates generally to highly reflective and highly absorptive wavelength selective surfaces and more particularly such materials formed using multiple conductive elements over a ground plane.

BACKGROUND OF THE INVENTION

Frequency selective surfaces can be provided to selectively reduce reflections from incident electromagnetic radiation. Such surfaces are often employed in signature management applications to reduce radar returns. These applications are typically employed within the radio frequency portion of the electromagnetic spectrum.

As modern radar systems are often equipped with different and even multiple frequency bands, such signature management surfaces are preferably broad band, reducing reflections over a broad portion of the spectrum. Examples of known frequency selective surfaces providing such a response include one or more than one dielectric layers, which may be disposed above a ground plane. Thickness of the dielectric layers combined with the selected material properties reduce reflected radiation. The thickness of one or more of the layers is a predominant design criteria and is often on the order of one quarter wavelength. Unfortunately, such structures can be complicated and relatively thick, depending upon the selected dielectric materials and wavelength of operation, particularly since multiple layers are often employed.

The shapes can be selected to provide a resonant response having a preferred polarization. For example, surface features having an elongated shape provide a resonant response that is more pronounced in a polarization that is related to the orientation of the elongated shape. Thus, an array of vertically aligned narrow rectangles produces a response having a vertically aligned linear polarization. In general, preferred polarizations can be linear, elliptical, and circular.

The use of multiple frequency selective surfaces disposed above a ground plane, for radio frequency applications, is described in U.S. Pat. No. 6,538,596 to Gilbert. The frequency selective surfaces can include conductive materials in a geometric pattern with a spacing of the multiple frequency selective surface layers, which can be closer than a quarter wave. However, Gilbert seems to rely on the multiple frequency selective surfaces providing a virtual continuous quarter wavelength effect. Such a quarter wavelength effect results in a canceling of the fields at the surface of the structure. Thus, although individual layers may be spaced at less than one-quarter wavelength (e.g., $\lambda/12$ or $\lambda/16$), Gilbert relies on macroscopic (far field) superposition of resonances from three of four sheets, such that the resulting structure thickness will be on the order of one-quarter wavelength.

SUMMARY OF THE INVENTION

What is needed is a simple, thin, highly reflective and highly absorptive wavelength selective surface capable of providing a tunable absorption band. Preferably, the location of the absorption band as well as its bandwidth can be tuned.

Various embodiments of the present invention provide an apparatus and method for providing a tunable absorption band in a highly reflective wavelength selective surface. An array of surface elements are defined in an electrically conductive layer disposed above a continuous electrically conductive layer, or ground plane.

In one aspect, the invention relates to a device for selectively absorbing incident electromagnetic radiation. The device includes an electrically conductive surface layer including an arrangement of multiple surface elements. An electrically isolating intermediate layer defines a first surface in communication with the electrically conductive surface layer. A continuous electrically conductive backing layer is provided in communication with a second surface of the electrically isolating intermediate layer. The arrangement of surface elements selectively couples at least a portion of the incident electromagnetic radiation between itself and the continuous electrically conductive backing layer, such that the resonant device selectively reflects incident radiation responsive to the coupling. Alternatively or in addition, the device selectively absorbs incident radiation responsive to the coupling.

In another aspect, the invention relates to a process of selectively absorbing incident radiation. A first electrically conductive layer is provided including multiple discrete surface elements. A continuous electrically conducting ground plane is also provided. The first electrically conductive layer is separated from the continuous electrically conductive ground plane using an intermediate layer. The resulting structure couples between at least one of the multiple surface elements and the continuous electrically conducting ground plane, at least a portion of electromagnetic radiation incident upon the first electrically conductive layer. At least a portion of the incident radiation that is not coupled is reflected.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

A description of preferred embodiments of the invention follows.

Figure 1:
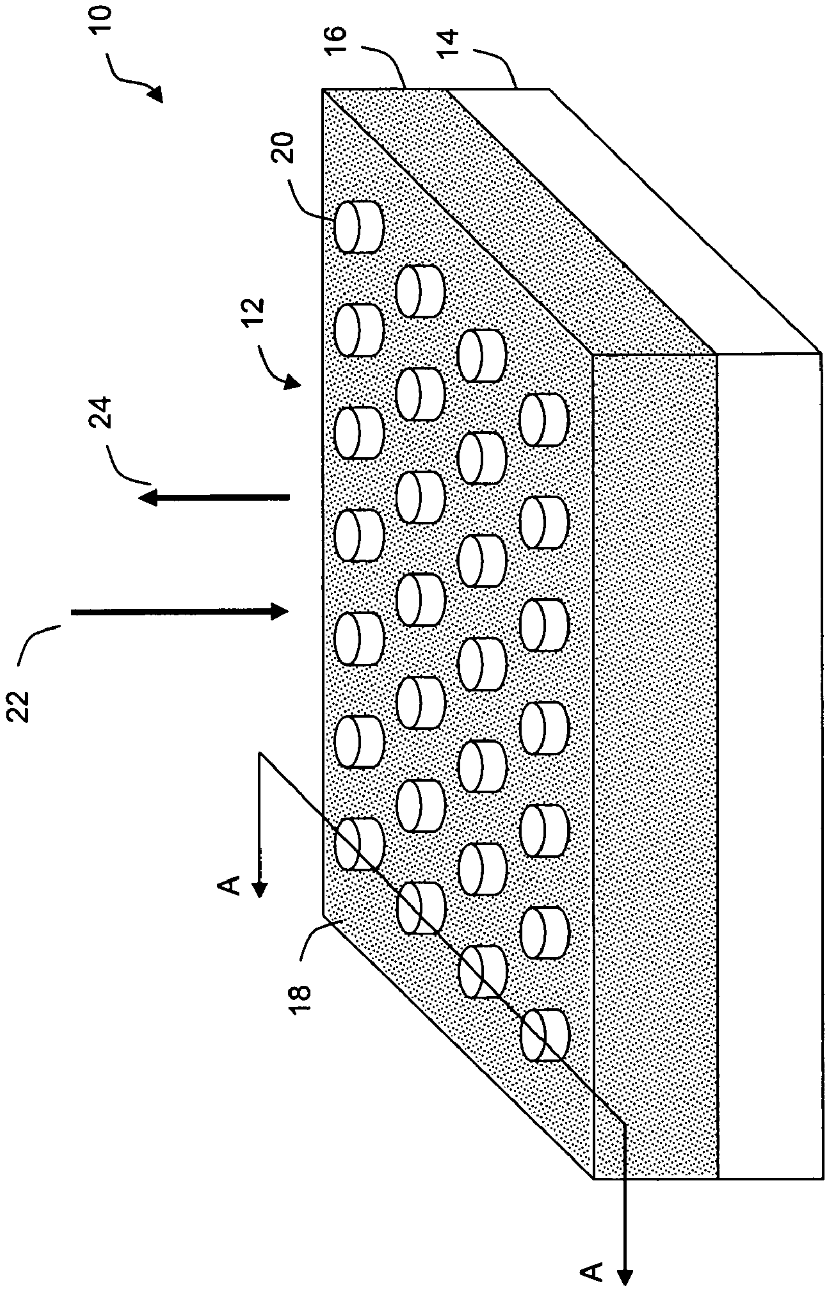
FIG. 1 shows a top perspective view of one embodiment of a wavelength selective surface having a rectangular array of electrically conductive surface elements.

An exemplary embodiment of a wavelength selective surface 10 is shown in FIG. 1. The wavelength selective surface 10 includes at least three distinguishable layers. The first layer is an electrically conductive outer or surface layer 12 including an arrangement of surface elements 20. The surface elements 20 of the outer layer 12 are disposed at a height above an inner layer including a continuous electrically conductive sheet, or ground layer 14. The arrangement of surface elements 20 and ground layer 14 is separated by an intermediate layer 16 disposed therebetween. At least one function of the intermediate layer 16 is to maintain a physical separation between the arrangement of surface elements 20 and the ground layer 14. The intermediate layer 16 also provides electrical isolation between the two electrically conductive layers 12, 14.

In operation, wavelength selective surface 10 is exposed to incident electromagnetic radiation 22. A variable portion of the incident radiation 22 is coupled to the wavelength selective surface 10. The level of coupling depends at least in part upon the wavelength of the incident radiation 22 and a resonant wavelength of the wavelength selective surface 10, as determined by related design parameters. Radiation coupled to the wavelength selective surface 10 can also be referred to as absorbed radiation. At other non-resonant wavelengths, a substantial portion of the incident radiation is reflected 24.

In more detail, the electrically conductive surface layer 12 includes multiple discrete surface features, such as the electrically conductive surface elements 20 arranged in a pattern along a surface 18 of the intermediate layer 16. The discrete nature of the arrangement of surface features 20 requires that individual surface elements 20 are isolated from each other. This also precludes interconnection of two or more individual surface elements 20 by electrically conducting paths. Two or more individual surface elements which are connected electrically form a composite surface element which gives rise to a new resonance.

The electrically conductive surface layer 12 including an arrangement of surface elements 20 is typically flat, having a smallest dimension, height, measured perpendicular to the intermediate layer surface 18. In general, each surface element 20 defines a surface shape and a height or thickness measured perpendicular to the intermediate layer surface 18. In general, the surface shape can be any closed shape, such as closed curves, regular polygons, irregular polygons, star-shapes having three or more legs, and other closed structures bounded by piecewise continuous surfaces including one or more curves and lines. In some embodiments, the surface shapes can include annular features, such as ring shaped patch with an open center region. More generally, the annular features have an outer perimeter defining the outer shape of the patch and an inner perimeter defining the shape of the open inner region of the patch. Each of the outer an inner perimeters can have a similar shape, as in the ring structure, or a different shape. Shapes of the inner and outer perimeters can include any of the closed shapes listed above (e.g., a round patch with a square open center).

Each of the electrically conductive surface elements 20 is formed with an electrically conductive material. Such conductive materials include ordinary metallic conductors, such as aluminum, copper, gold, silver, iron, nickel, tin, lead, and zinc; as well as combinations of one or more metals in the form of a metallic alloy, such as steel, and ceramic conductors such as indium tin oxide and titanium nitride. Alternatively or in addition, conductive materials used in formation of the surface elements 20 include semiconductors. Preferably, the semiconductors are electrically conductive. Exemplary semiconductor materials include: silicon and germanium; compound semiconductors such as silicon carbide, gallium-arsenide and indium-phosphide; and alloys such as silicon-germanium and aluminum-gallium-arsenide. Electrically conductive semiconductors are typically doped with one or more impurities in order to provide good electrical conductivity. Similarly, the ground layer 14 can include one or more electrically conductive materials, such as those described herein.

The intermediate layer 16 can be formed from an electrically insulative material, such as a dielectric providing electrical isolation between the arrangement of surface elements 20 and the ground layer 14. Some examples of dielectric materials include silicon dioxide ($SiO_2$); alumina ($Al_2O_3$); aluminum oxynitride; silicon nitride ($Si_3N_4$). Other exemplary dielectrics include polymers, rubbers, silicone rubbers, cellulose materials, ceramics, glass, and crystals. Dielectric materials also include: semiconductors, such as silicon and germanium; compound semiconductors such as silicon carbide, gallium-arsenide and indium-phosphide; and alloys such as silicon-germanium and aluminum-gallium-arsenide; and combinations thereof. As dielectric materials tend to concentrate an electric field within themselves, an intermediate dielectric layer 16 will do the same, concentrating an induced electric field between each of the surface elements 20 and a proximal region of the ground layer 14. Beneficially, such concentration of the electric-field tends to enhance electromagnetic coupling of the arrangement of surface elements 20 to the ground layer 14.

Dielectric materials can be characterized by parameters indicative of their physical properties, such as the real and imaginary portions of the index of refraction, often referred to as “n” and “k.” Although constant values of these parameters n, k can be used to obtain an estimate of the material’s performance, these parameters are typically wavelength dependent for physically realizable materials. In some embodiments, the intermediate layer 16 includes a so-called high-k material. Examples of such materials include oxides, which can have k values ranging from 0.001 up to 10.

Figure 2:
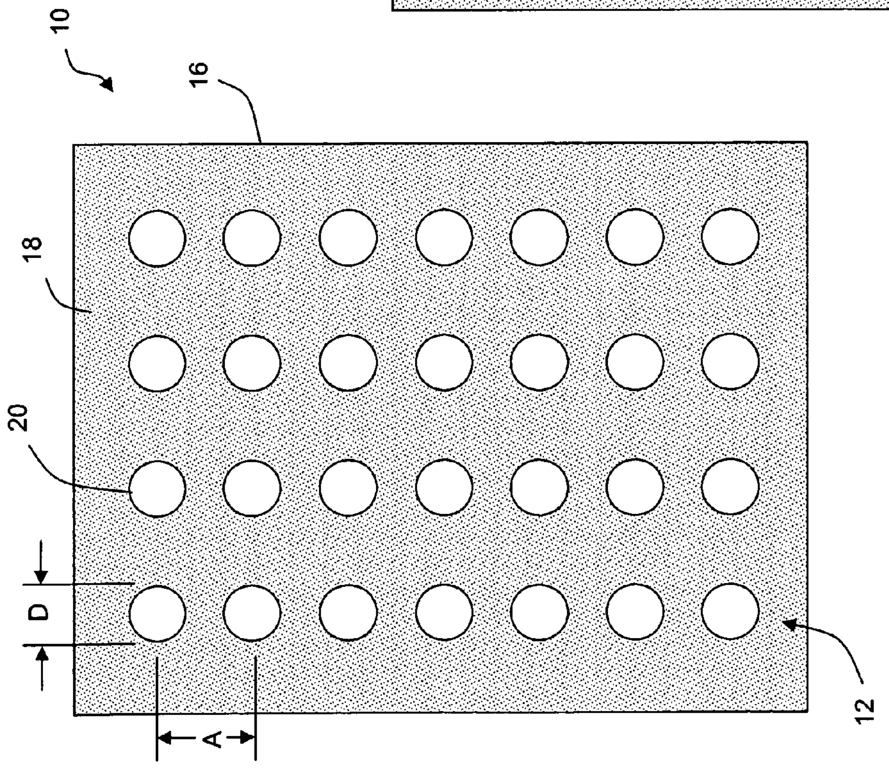
FIG. 2 shows a top planar view of the wavelength selective surface of FIG. 1.

The arrangement of surface elements 20 can be configured in a preferred arrangement, or array on the intermediate layer surface 18. Referring now to FIG. 2, the wavelength selective surface 10 includes an exemplary array of flattened, electrically conductive surface elements 20. Multiple surface elements 20 are arranged in a square grid along the intermediate layer surface 18. A square grid or matrix arrangement is an example of a regular array, meaning that spacing between adjacent surface elements 20 is substantially uniform. Other examples of regular arrays, or grids include oblique grids, centered rectangular grids, hexagonal grids, triangular grids, and Archimedean grids. In some embodiments, the grids can be irregular and even random. Each of the individual elements 20 can have substantially the same shape, such as the circular shape shown.

Although flattened elements are shown and described, other shapes are possible. For example, each of the multiple surface elements 20 can have non-flat profile with respect to the intermediate layer surface 18, such as a parallelepiped, a cube, a dome, a pyramid, a trapezoid, or more generally any other shape. One major advantage of the present invention over other prior art surfaces is a relaxation of the fabrication tolerances. The high field region resides underneath each of the multiple surface elements 20, between the surface element 20 and a corresponding region of the ground layer 14.

Figure 3:
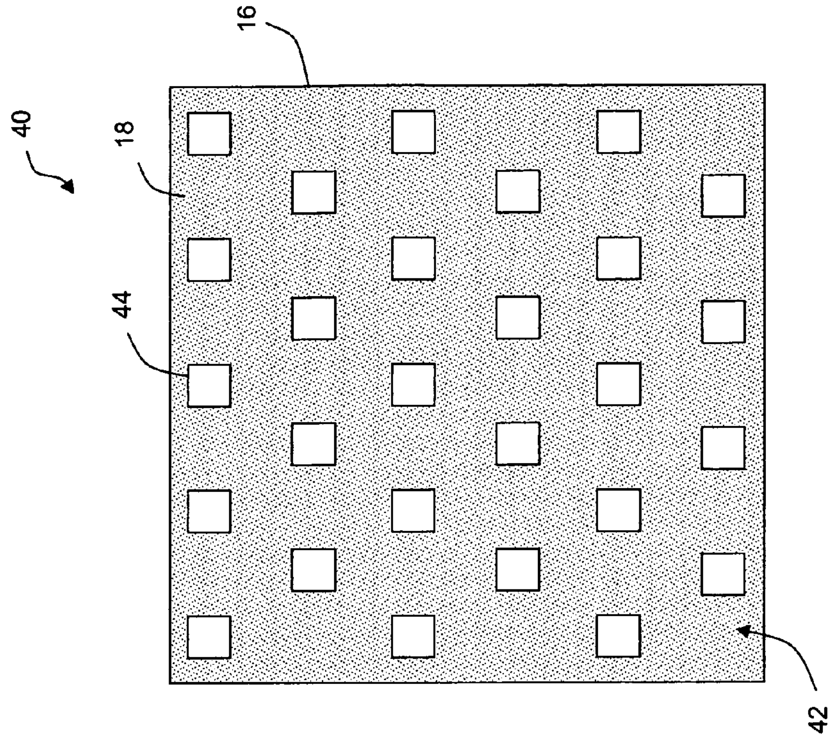
FIG. 3 shows a top planar view of another embodiment of a wavelength selective surface in accordance with the principles of the present invention having a hexagonal array of electrically conductive square surface elements.

In more detail, each of the circular elements 20 has a respective diameter D. In the exemplary square grid, each of the circular elements 20 is separated from its four immediately adjacent surface elements 20 by a uniform grid spacing A measured center-to-center. An alternative embodiment of another wavelength selective surface 40 including a hexagonal arrangement, or array of surface elements 42 is shown in FIG. 3. Each of the discrete surface elements includes a square surface element 44 having a side dimension D'. Center-to-center spacing between immediately adjacent elements 44 of the hexagonal array 42 is about A'. For operation in the infrared portion of the electromagnetic spectrum, D will generally be between about 0.5 microns for near infrared and 50 microns for the far infrared and terahertz, understanding that any such limits are not firm and will very depending upon such factors as n, k, and the thickness of layers.

Array spacing A can be as small as desired, as long as the surface elements 20 do not touch each other. Thus, a minimum spacing will depend to some extent on the dimensions of the surface feature 20. Namely, the minimum spacing must be greater than the largest diameter of the surface elements (i.e., A>D). The surface elements can be separated as far as desired, although absorption response suffers from increased grid spacing as the fraction of the total surface covered by surface elements falls below 10%.

Figure 4:
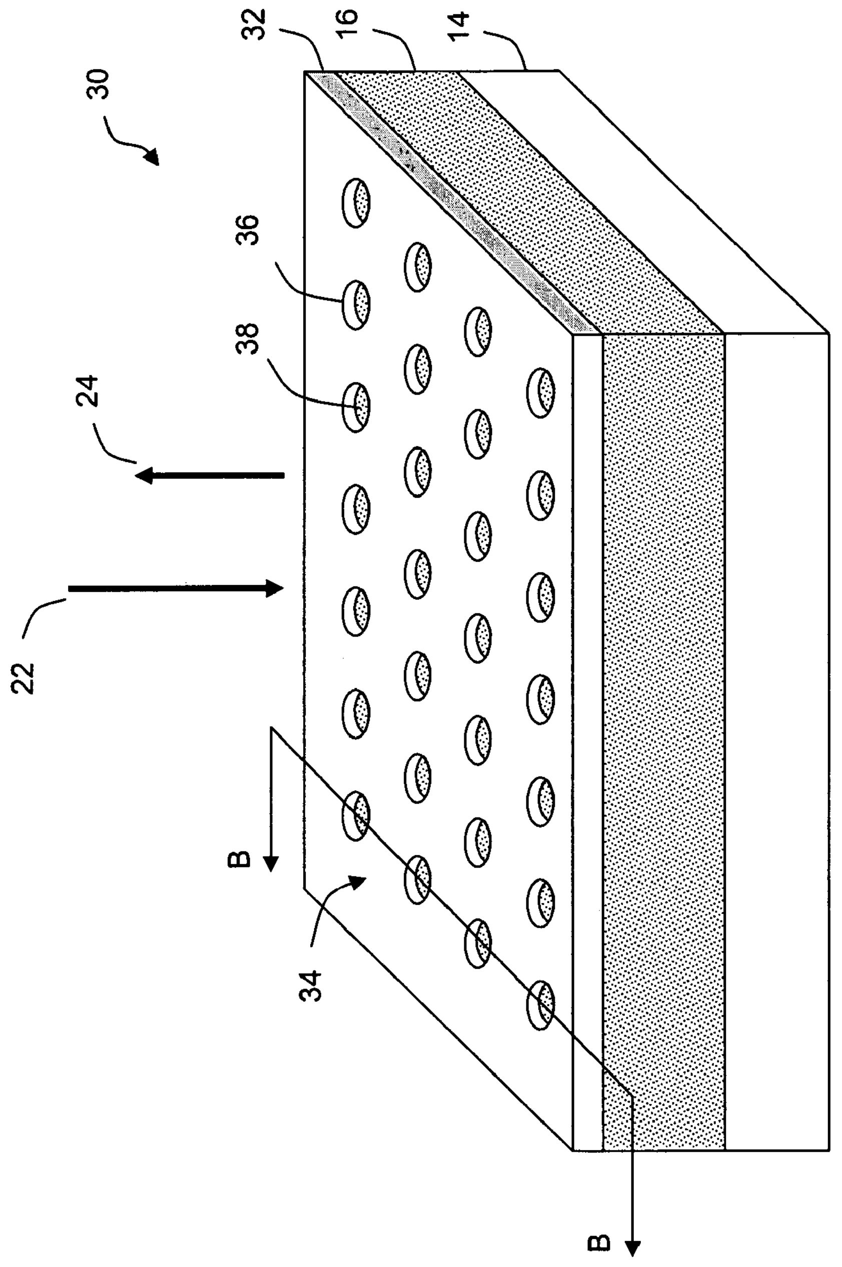
FIG. 4 shows a top perspective view of an alternative embodiment of a wavelength selective surface having apertures defined in an electrically conductive surface layer.

An exemplary embodiment of an alternative family of wavelength selective surfaces 30 is shown in FIG. 4. The alternative wavelength selective surfaces 30 also include in intermediate layer 16 stacked above a ground layer 14; however, an electrically conductive surface 32 layer includes a complementary feature 34. The complementary feature 34 includes the electrically conductive layer 32 defining an arrangement of through apertures 36, holes, or perforations.

The electrically conductive layer 32 is generally formed having a uniform thickness. The arrangement of through apertures 34 includes multiple individual through apertures 36, each exposing a respective surface region 38 of the intermediate layer 16. Each of the through apertures 36 forms a respective shape bounded by a closed perimeter formed within the conductive layer 32. Shapes of each through aperture 36 include any of the shapes described above in reference to the electrically conductive surface elements 20 (FIG. 1), 44 (FIG. 3).

Additionally, the through apertures 36 can be arranged according to any of the configurations described above in reference to the electrically conductive surface elements 20, 44. This includes a square grid, a rectangular grid, an oblique grid, a centered rectangular grid, a triangular grid, a hexagonal grid, and random grids. Thus, any of the possible arrangements of surface elements 36 and corresponding exposed regions of the intermediate layer surface 18 can be duplicated in a complementary sense in that the surface elements 20 are replaced by through apertures 36 and the exposed regions of the intermediate layer surface 18 are replaced by the electrically conductive layer 32.

Figure 5A:
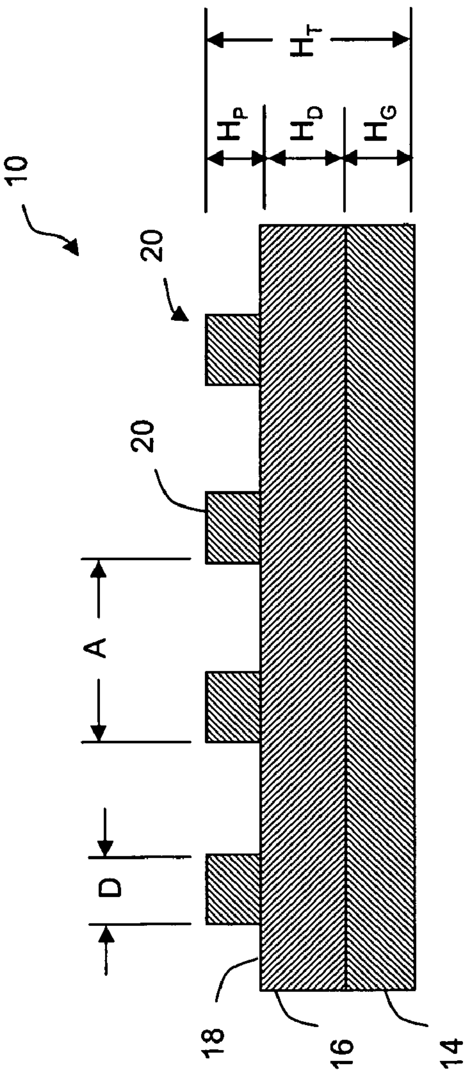
FIG. 5A shows a cross-sectional elevation view of the wavelength selective surface of FIG. 1 taken along A-A.
Figure 5B:
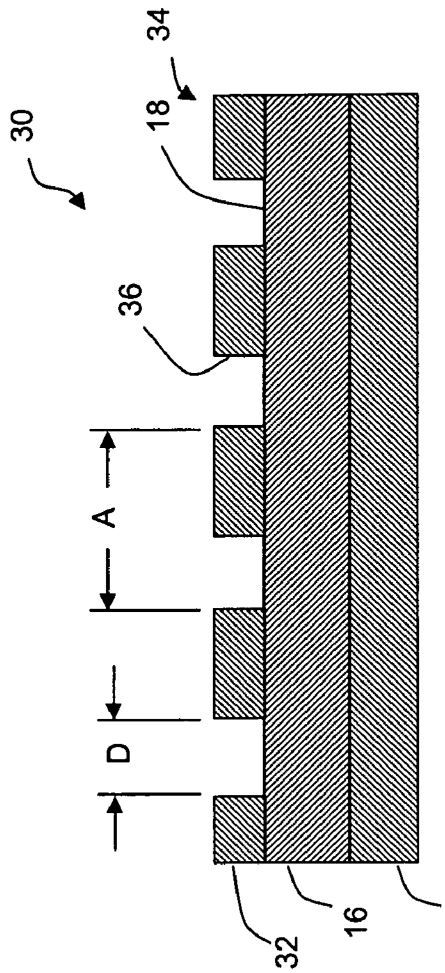
FIG. 5B shows a cross-sectional elevation view of the wavelength selective surface of FIG. 4 taken along B-B.

A cross-sectional elevation view of the wavelength selective surface 10 is shown in FIG. 5A. The electrically conductive ground layer 14 has a substantially uniform thickness $H_G$. The intermediate layer 16 has a substantially uniform thickness $H_D$, and each of the individual surface elements 20 has a substantially uniform thickness $H_P$. The different layers 12, 14, 16 can be stacked without gaps therebetween, such that a total thickness $H_T$ of the resulting wavelength selective surface 10 is substantially equivalent to the sum of the thicknesses of each of the three individual layers 14, 16, 12 (i.e., $H_T=H_G+H_D+H_P$). A cross-sectional elevation view of the complementary wavelength selective surface 30 is shown in FIG. 5B and including a similar arrangement of the three layers 14, 16, 32.

In some embodiments, the intermediate insulating layer has a non-uniform thickness with respect to the ground layer. For example, the intermediate layer may have a first thickness $H_D$ under each of the discrete conducting surface elements and a different thickness, or height at regions not covered by the surface elements. It is important that a sufficient layer of insulating material be provided under each of the surface elements to maintain a design separation and to provide isolation between the surface elements and the ground layer. In at least one example, the insulating material can be substantially removed at all regions except those immediately underneath the surface elements. In other embodiments, the insulating layer can include variations, such as a taper between surface elements. At least one benefit of the inventive design is a relaxation of design tolerances that results in a simplification of fabrication of the devices.

The thickness chosen for each of the respective layers 12, 32, 16, 14 ($H_P$, $H_D$, $H_G$) can be independently varied for various embodiments of the wavelength selective surfaces 10, 30. For example, the ground plane 14 can be formed relatively thick and rigid to provide a support structure for the intermediate and surface layers 16, 12, 32. Alternatively, the ground plane 14 can be formed as a thin layer, as long as a thin ground plane 14 forms a substantially continuous electrically conducting layer of material providing the continuous ground. Preferably, the ground plane 14 is at least as thick as one skin depth within the spectral region of interest. Similarly, in different embodiments of the wavelength selective surfaces 10, 30, the respective surface layer 12, 32 can be formed with a thickness $H_P$ ranging from relatively thin to relatively thick. In a relatively thin embodiment, the surface layer thickness $H_P$ can be a minimum thickness required just to render the intermediate layer surface 18 opaque. Preferably, the surface layer 12, 32 is at least as thick as one skin depth within the spectral region of interest.

Likewise, the intermediate layer thickness $H_D$ can be formed as thin as desired, as long as electrical isolation is maintained between the outer and inner electrically conducting layers 12, 32, 14. The minimum thickness can also be determined to prevent electrical arcing between the isolated conducting layers under the highest anticipated induced electric fields. Alternatively, the intermediate layer thickness $H_D$ can be formed relatively thick. The concept of thickness can be defined relative to an electromagnetic wavelength $\lambda_c$ of operation, or resonance wavelength. For example, the intermediate layer thickness $H_D$ can be selected between about $0.01\lambda_c$ in a relatively thin embodiment to about $0.5\lambda_c$ in a relatively thick embodiment.

The wavelength selective surfaces 10, 30 can be formed using standard semiconductor fabrication techniques. Alternatively or in addition, the wavelength selective surfaces 10, 30 can be formed using thin film techniques including vacuum deposition, chemical vapor deposition, and sputtering. In some embodiments, the conductive surface layer 12, 44 can be formed using printing techniques. The surface features can be formed by providing a continuous electrically conductive surface layer and then removing regions of the surface layer to form the surface features. Regions can be formed using standard physical or chemical etching techniques. Alternatively or in addition, the surface features can be formed by laser ablation, removing selected regions of the conductive material from the surface, or by nano-imprinting or stamping, or other fabrication methods known to those skilled in the art.

Figure 6B:
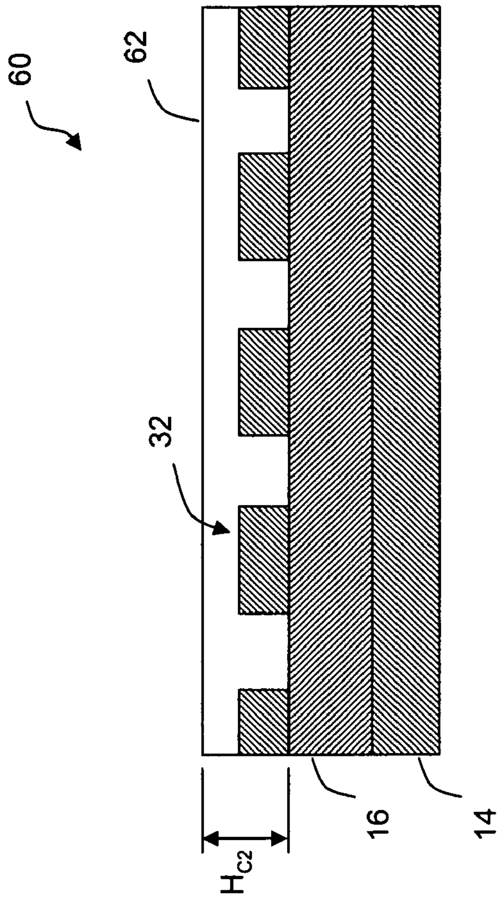
FIG. 6B shows a cross-sectional elevation view of an alternative embodiment of a wavelength selective surface having an over layer covering an electrically conductive surface layer and apertures defined therein.
Figure 6A:
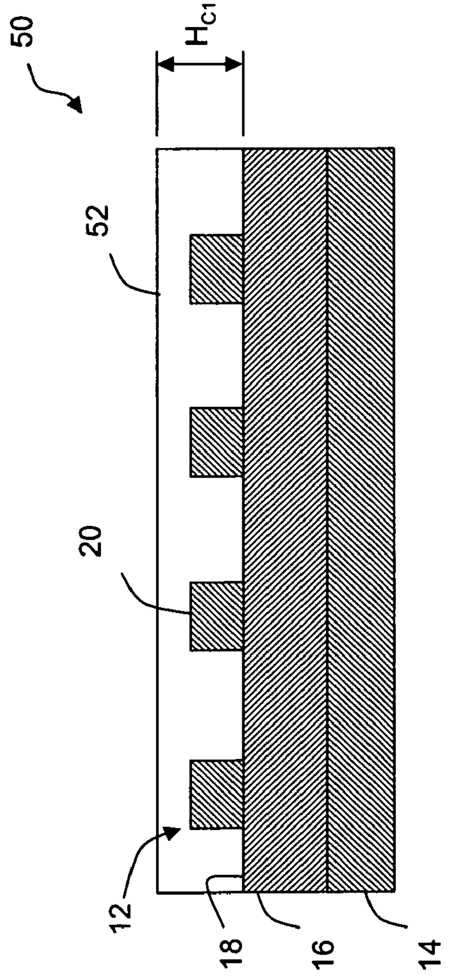
FIG. 6A shows a cross-sectional elevation view of an alternative embodiment of a wavelength selective surface having an over layer covering electrically conductive surface elements.

Referring to FIG. 6A a cross-sectional elevation view of an alternative embodiment of a wavelength selective surface 50 is shown having an over layer 52. Similar to the embodiments described above, the wavelength selective surface 50 includes an electrically conductive outer layer 12 having an arrangement of surface elements 20 (FIG. 1) disposed at a height above a ground layer 14 and separated therefrom by an intermediate layer 16. The over layer 52 represents a fourth layer, or superstrate 52 provided on top of the electrically conductive surface layer 12.

The over layer 52 can be formed having a thickness $H_{C1}$ measured from the intermediate layer surface 18. In some embodiments, the over layer thickness $H_{C1}$ is greater than thickness of the surface elements 20 (i.e., $H_{C1}>H_P$). The over layer 52 can be formed with varying thickness to provide a planar external surface. Alternatively or in addition, the over layer 52 can be formed with a uniform thickness, following a contour of the underlying electrically conductive surface 12.

An over layering material 52 can be chosen to have selected physical properties (e.g., k, n) that allow at least a portion of incident electromagnetic radiation to penetrate into the over layer 52 and react with one or more of the layers 12, 14, and 16 below. In some embodiments, the overlying material 52 is optically transparent in the vicinity of the primary absorption wavelength, to pass substantially all of the incident electromagnetic radiation. For example, the overlying material 52 can be formed from a glass, a ceramic, a polymer, or a semiconductor. The overlaying material 52 can be applied using any one or more of the fabrication techniques described above in relation to the other layers 12, 14, 16 in addition to painting and/or dipping.

In some embodiments, the over layer 52 provides a physical property chosen to enhance performance of the wavelength selective device in an intended application. For example, the overlaying material 52 may have one or more optical properties, such as absorption, refraction, and reflection. These properties can be used to advantageously modify incident electromagnetic radiation. Such modifications include focusing, de-focusing, and filtering. Filters can include low-pass, high-pass, band pass, and band stop.

The overlaying material 52 can be protective in nature allowing the wavelength selective surface 50 to function, while providing environmental protection. For example, the overlaying material 52 can protect the surface conductive layer 12 from corrosion and oxidation due to exposure to moisture. Alternatively or in addition, the overlaying material 52 can protect either of the exposed layers 12, 16 from erosion due to a harsh (e.g., caustic) environment. Such harsh environments might be encountered routinely when the wavelength selective surface is used in certain applications. At least one such application that would benefit from a protective overlaying material 52 would be a marine application, in which a protective over layer 52 would protect the electrically conductive layer 12 or 32 from corrosion.

In another embodiment shown in FIG. 6B, a wavelength selective surface 60 includes an overlying material 62 applied over a conductive layer 32 defining an arrangement of through apertures 34 (FIG. 4). The overlying material 62 can be applied with a maximum thickness $H_{C2}$ measured from the intermediate layer surface 18 to be greater than the thickness of the conductive layer 32 (i.e., $H_{C2}>H_P$). The overlaying material 62 again can provide a planar external surface or a contour surface. Accordingly, a wavelength selective surface 60 having apertures 36 defined in an electrically conductive layer 32 is covered by an overlying material 62. The performance and benefits of such a device are similar to those described above in relation to FIG. 6A.

Figure 7A:
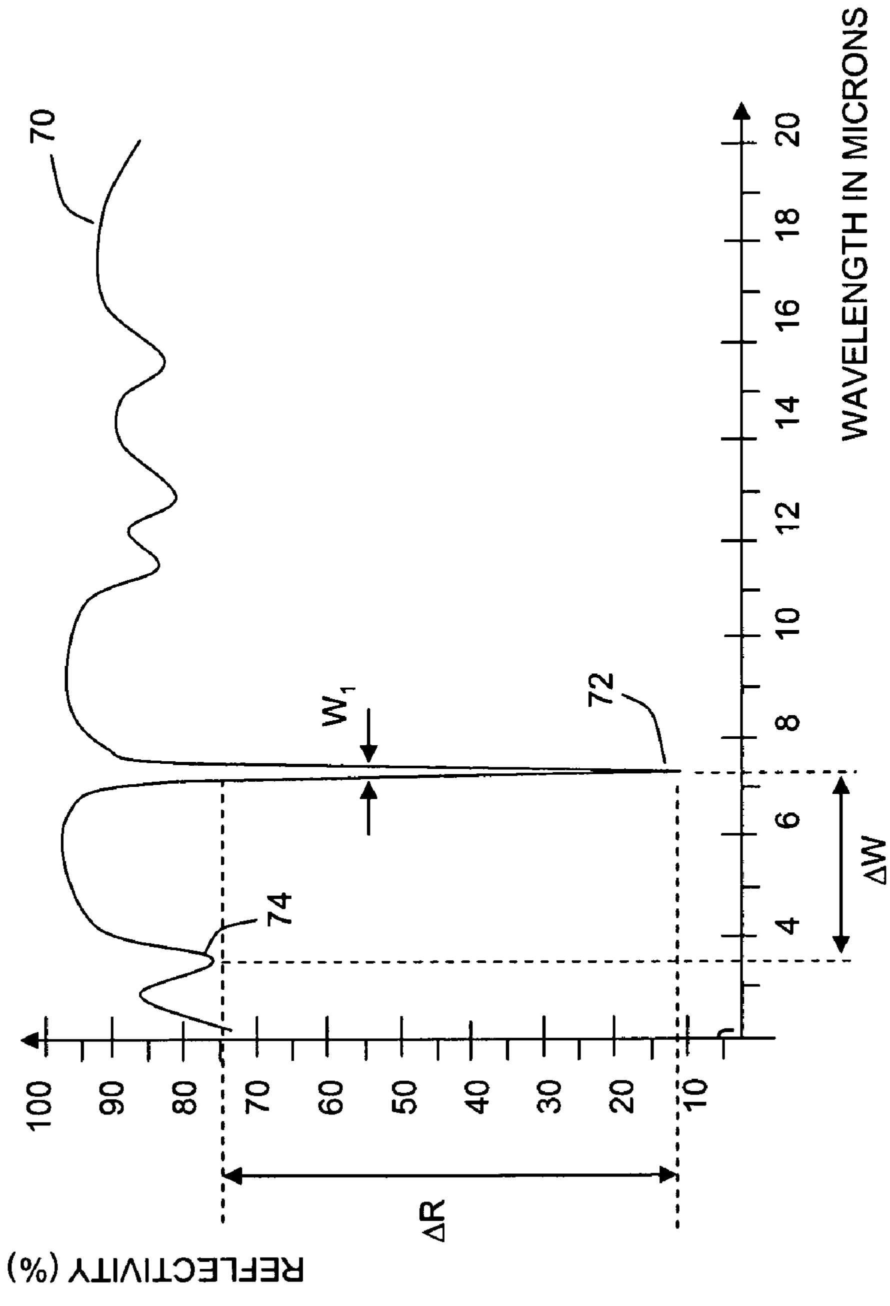
FIG. 7A shows in graphical form, an exemplary reflectivity-versus-wavelength response of a narrowband wavelength selective surface constructed in accordance with the principles of the present invention.

Referring to FIG. 7A, an exemplary reflectivity versus wavelength response curve 70 of a representative narrow-resonance response is shown in graphical form. The response curve 70 is achieved by exposing a wavelength selective surface 10 (FIG. 1) constructed in accordance with the principles of the present invention to incident electromagnetic radiation 22 (FIG. 1) within a band including a resonance. As shown, the reflectivity to incident electromagnetic radiation varies according to the curve 70 within the range of 0% to 100%. As the wavelength of the incident radiation 22 is varied from 2 to 20 microns, the reflectivity starts at a relatively high value of about 75%, increases to a value of over 85% at about 3 microns, reduces back to about 75% at about 3.5 microns, and increases again to nearly 100% between about 3.5 and 7 microns. Between 7 and 8 microns, the reflectivity response curve 70 incurs a second and more pronounced dip 72 to less then 20% reflectivity. The second dip 72 is steep and narrow, corresponding to absorption of incident electromagnetic radiation by the surface 10. The reflectivity response curve 70 at wavelengths beyond about 8 microns rises sharply back to more than 90% and remains above about 80% out to at least 20 microns. This range, from 2 to 20 microns, represents a portion of the electromagnetic spectrum including infrared radiation.

The second and much more pronounced dip 72 corresponds to a primary resonance of the underlying wavelength selective surface 10. As a result of this resonance, a substantial portion of the incident electromagnetic energy 22 is absorbed by the wavelength selective surface 10. A measure of the spectral width of the resonance response 70 can be determined as a width in terms of wavelength normalized to the resonant wavelength (i.e., $\Delta\lambda/\lambda_c$ or $d\lambda/\lambda_c$). Preferably, this width is determined at full-width-half-maximum (FWHM). For the exemplary curve, the width of the absorption band at FWHM is less than about 0.2 microns with an associated resonance frequency of about 7 microns. This results in a spectral width, or $d\lambda/\lambda_c$ of about 0.03. Generally, a $d\lambda/\lambda_c$ value of less than about 0.1 can be referred to as narrowband. Thus, the exemplary resonance is representative of a narrowband absorption response.

Results supported by both computational analysis of modeled structures and measurements suggest that the resonant wavelength associated with the primary resonance response 72 is sensitive to a maximum dimension of the electrically conductive surface elements (e.g., a diameter of a circular patch D, or a side length of a square patch D'). As the diameter of the surface elements is increased, the wavelength of the primary absorption band 72 also increases. Conversely, as the diameter of the surface elements is decreased, the wavelength of the primary absorption band 72 also decreases.

The first, less pronounced dip 74 in reflectivity corresponds to a secondary absorption band of the underlying wavelength selective surface 10. Results supported by both computational analysis of modeled structures and measurements suggest that the wavelength associated with the secondary absorption band 74 corresponds at least in part to a center-to-center spacing of the multiple electrically conductive surface elements. As the spacing between surface elements 20 in the arrangement of surface elements 20 is reduced, the wavelength of the secondary absorption band 74 decreases. Conversely, as the spacing between the arrangement of surface elements 20 is increased, the wavelength of the secondary absorption band 74 increases. The secondary absorption band 74 is typically less pronounced than the primary absorption band 72, such that a change in reflectivity ΔR can be determined between the two absorption bands 74, 72. A difference in wavelength between the primary and secondary absorption bands 72, 74 is shown as ΔW.

In general, the performance may be scaled to different wavelengths according to the desired wavelength range of operation. Thus, by scaling the design parameters of any of the wavelength selective surfaces as described herein, resonant performance can be obtained within any desired region of the electromagnetic spectrum. Resonant wavelengths can range down to visible light and even beyond into the ultraviolet and X-ray. At the other end of the spectrum, the resonant wavelengths can range into the terahertz band (e.g., wavelengths between about 1 millimeter and 100 microns) and even up to radio frequency bands (e.g., wavelengths on the order of centimeters to meters). Operation at the shortest wavelengths will be limited by available fabrication techniques. Current techniques can easily achieve surface feature dimensions to the sub-micron level. It is conceivable that such surface features could be provided at the molecular level using currently available and emerging nanotechnologies. Examples of such techniques are readily found within the field of micro-mechanical-electrical systems (MEMS).

Figure 7B:
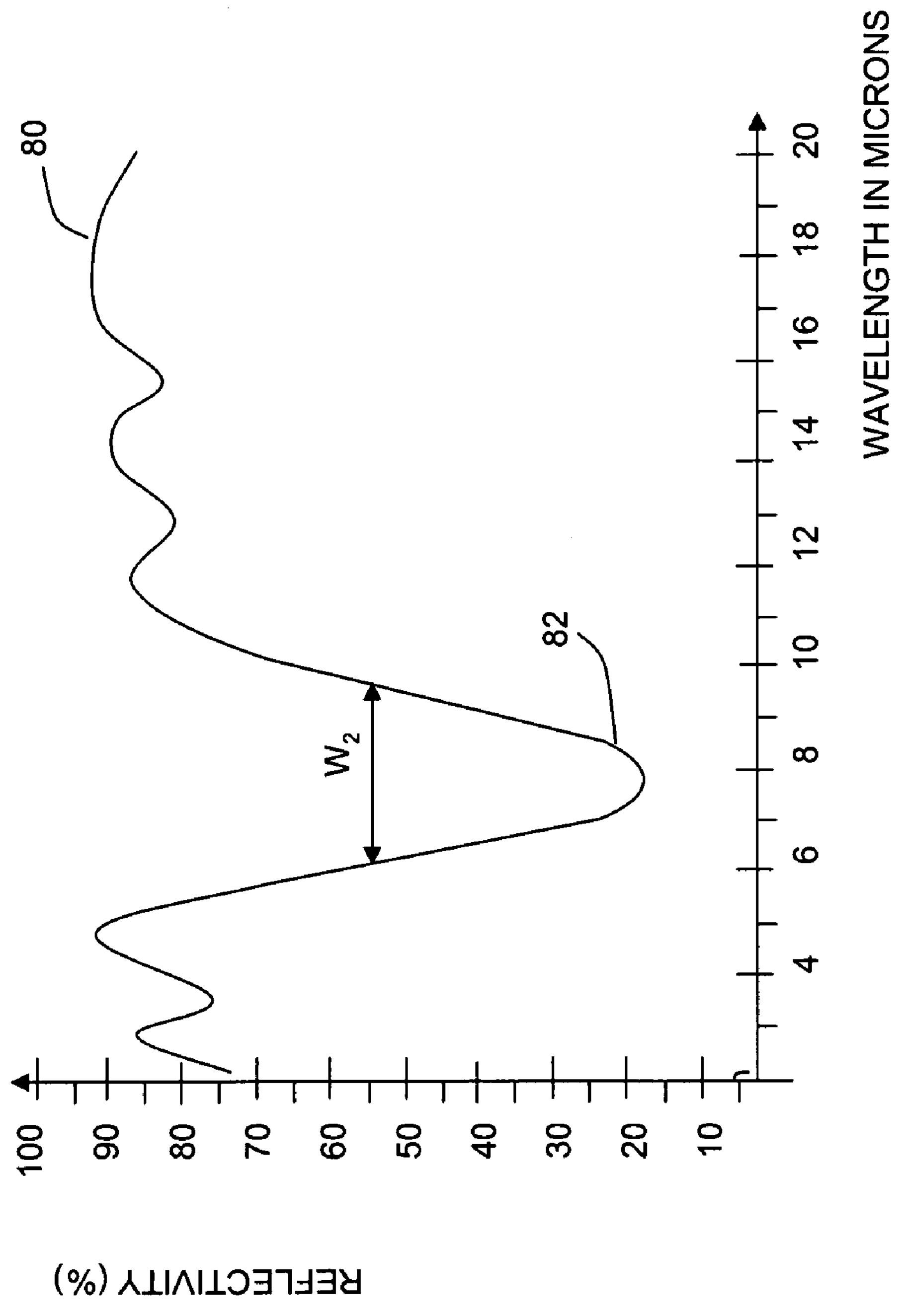
FIG. 7B shows in graphical form, an exemplary reflectivity-versus-wavelength response of a wideband wavelength selective surface constructed in accordance with the principles of the present invention.

Referring to FIG. 7B, an exemplary reflectivity versus wavelength response curve 80 of a wide-resonance wavelength selective surface is shown in graphical form. This wideband response curve 80 can also be achieved with the wavelength selective surface 10 (FIG. 1) constructed in accordance with the principles of the present invention, but having a different selection of design parameters. Here, a primary absorption band 82 occurs at about 8 microns, with wavelength range at FWHM of about 3 microns. This results in a spectral width $\Delta\lambda/\lambda_c$ of about 0.4. A spectral width value $\Delta\lambda/\lambda_c$ greater than 0.1 can be referred to as broadband. Thus, the underlying wavelength selective surface 10 can also be referred to as a broadband structure.

One or more of the physical parameters of the wavelength selective surface 10 can be varied to control reflectivity response of a given wavelength selective surface. For example, the thickness of one or more layers (e.g., surface element thickness $H_P$, dielectric layer thickness $H_D$, and over layer thickness $H_C$) can be varied. Alternatively or in addition, one or more of the materials of each of the different layers can be varied. For example, the dielectric material can be substituted with another dielectric material having a different n and k values. The presence or absence of an over layer 52 (FIG. 6A), as well as the particular material selected for the over layer 52 can also be used to vary the reflectivity or absorption response of the wavelength selective surface. Similar performance changes may be achieved by changing the material of the ground plane, change the dimension D of the surface elements, or by changing the shape of the surface elements.

In a first example, a wavelength selective surface includes an intermediate layer formed with various diameters of surface patches. The wavelength selective surface includes a triangular array of round aluminum patches placed over an aluminum film ground layer. The various surfaces are each formed with surface patches having a different respective diameter. A summary of results obtained for the different patch diameters is included in Table 1. In each of these exemplary embodiments, the patch spacing between adjacent patch elements was about 3.4 microns, and the thickness or depth of the individual patches and of the ground layer film were each about 0.1 micron. An intermediate, dielectric layer having thickness of about 0.2 microns was included between the two aluminum layers. It is worth noting that the overall thickness of the wavelength selective surface is about 0.4 microns—a very thin material. The exemplary dielectric has an index of refraction of about 3.4. Table 1 includes wavelength values associated with the resulting primary absorptions. As shown, the resonant wavelength increases with increasing patch size.

TABLE 1

Primary Absorption Wavelength Versus Patch Diameter

| Patch Diameter | Resonant Wavelength ($\lambda_c$) |
|---|---|
| 1.25 μm | 4.1 μm |
| 1.75 μm | 5.5 μm |
| 2.38 μm | 7.5 μm |
| 2.98 μm | 9.5 μm |

In another example, triangular arrays of circular patches having a uniform array spacing of 3.4 microns and patch diameter of 1.7 microns are used. A dielectric material provided between the outer conducting layers is varied. As a result, the wavelength of the primary absorption shifts. Results are included in Table 2.

TABLE 2

Resonance Versus Dielectric Material

| Dielectric material | Resonant Wavelength (λc) |
|---|---|
| Oxide | 5.8 μm |
| Nitride | 6.8 μm |
| Silicon | 7.8 μm |

While this invention has been particularly shown and described with references to preferred embodiments thereof, it will be understood by those skilled in the art that various changes in form and details may be made therein without departing from the scope of the invention encompassed by the appended claims.

What is claimed is:

1. A device for selectively absorbing incident electromagnetic visible or infrared radiation comprising:
- a selective surface comprising:
  - a first electrically conductive layer including a plurality surface elements;
  - an electrically isolating intermediate layer defining a first surface in communication with the electrically conductive surface layer; and
  - a second, continuous electrically conductive layer in communication with a second surface of the electrically isolating intermediate layer,
- wherein the selective surface has a primary resonant absorption band for selectively absorbing incident visible or infrared radiation responsive to a resonant electromagnetic coupling between the plurality of surface elements and the continuous electrically conductive layer, and
- wherein the primary resonant absorption band has a central wavelength $\lambda c$ and a bandwidth $\Delta\lambda$, where $\Delta\lambda/\lambda c$ is 0.1 or less.

2. The device of claim 1, wherein the plurality of surface elements comprises a plurality of discrete electrically conductive elements.

3. The device of claim 2, wherein the thickness of the electrically isolating intermediate layer is about 0.01 $\lambda c$ or less.

4. The device of claim 2, wherein the plurality discrete electrically conductive elements comprises an array of uniformly shaped elements, wherein the uniformly shaped elements are selected from the group consisting of: closed curves; ellipses; circles; rectangles; squares; polygons; triangles; hexagons; parallelograms; annular structures; and star-shaped structures having at least three members each extending from a central portion of the star shape to a point of the star-shape.

5. The device of claim 1, wherein the thickness of the electrically isolating intermediate layer is less than one tenth of the central wavelength $\lambda c$ of the primary resonant absorption band.

6. The device of claim 1, wherein the surface elements have a size of less than about 50 micrometers.

7. The device of claim 6, wherein the surface elements have a size of less than about 0.5 micrometers.

8. The device of claim 1, wherein at least one of the first and second electrically conductive layers is formed from a metal.

9. The device of claim 1, wherein at least one of the first and second electrically conductive layers is formed from an electrically conductive semiconductor.

10. The device of claim 1, wherein the plurality of surface elements are arranged in an array, said array selected from the group consisting of: a rectangular grid; a square grid; a triangular grid; an Archimedean grid; an oblique grid; a centered rectangular grid; a hexagonal grid; and a random array.

11. The device of claim 1, wherein the at least one of $\lambda c$ and $\Delta\lambda$ of the primary resonant absorption band is determined by the dimensions of each surface element of the plurality of surface elements of the first electrically conductive layer.

12. The device of claim 1, wherein the selective surface has a secondary resonant absorption band determined by the spacing between surface elements of the plurality of surface elements.

13. The device of claim 1, wherein the electrically conductive surface layer comprises an electrical conductor defining a plurality of discrete through holes, and wherein the plurality of discrete through holes correspond to the plurality of surface elements.

14. The device of claim 13, wherein the plurality of discrete through holes comprise an array of uniformly shaped elements, wherein the uniformly shaped elements are selected from the group consisting of: closed curves; ellipses; circles; rectangles; squares; polygons; triangles; hexagons; parallelograms; annular structures; star-shaped structures each having at least three members each extending from a central portion of the star shape to a point of the star-shape; and annular shapes.

15. The device of claim 13, wherein the plurality of discrete through holes are arranged in an array, selected from the group consisting of: rectangular grids; square grids; triangular grids; Archimedean grids; oblique grids; centered rectangular grids; hexagonal grids; and random arrays.

16. The device of claim 1, wherein the at least one of $\lambda c$ and $\Delta\lambda$ of the primary resonant absorption band are determined at least one of: a thickness of the first electrically conductive layer; a thickness of the intermediate layer; a physical property of the intermediate layer; a physical property of each of the electrically conducting surface elements of the plurality of electrically conducting surface elements.

17. The device of claim 1, wherein the device comprises a secondary resonant absorption band determined by at least one of: a spacing between surface elements of the plurality of surface elements; thickness of the first electrically conductive layer; thickness of the intermediate layer; physical properties of the intermediate layer; physical properties of each of the electrically conducting surface elements of the plurality of electrically conducting surface elements.

18. A method of selectively reflecting incident visible or infrared radiation comprising:
- providing a selective surface comprising:
  - a first electrically conductive layer including a plurality surface elements;
  - an electrically isolating intermediate layer defining a first surface in communication with the electrically conductive surface layer; and
  - a second, continuous electrically conductive layer in communication with a second surface of the electrically isolating intermediate layer,
    - wherein the selective surface has a primary resonant absorption band for selectively absorbing incident visible or infrared radiation responsive to a resonant electromagnetic coupling between the plurality of surface elements and the continuous electrically conductive layer,
- receiving the incident visible or infrared radiation with the selective surface to absorb a portion of the incident visible or infrared radiation in the primary resonant absorption band; and
- reflecting at least a portion of the incident radiation outside of the primary resonant absorption band;
- wherein the primary resonant absorption band has a central wavelength $\lambda c$ and a bandwidth $\Delta\lambda$, where $\Delta\lambda/\lambda c$ is 0.1 or less.

19. The method of claim 18, wherein the plurality of surface elements comprises a plurality of discrete electrically conductive elements.

20. The method of claim 18, wherein the electrically conductive surface layer comprises an electrical conductor defining a plurality of discrete through holes, and wherein the plurality of discrete through holes correspond to the plurality of surface elements.

21. The method of claim 20, wherein the thickness of the electrically isolating intermediate layer is about 0.01 $\lambda c$ or less.

22. The method of claim 20, wherein the surface elements have a size of less than about 50 micrometers.

23. The method of claim 20, wherein the surface elements have a size of less than about 0.5 micrometer.

24. The method of claim 18, wherein the thickness of the electrically isolating intermediate layer is less than one tenth of the central wavelength λc of the primary resonant absorption band.

25. The method of claim 18, wherein the selective surface has a secondary resonant absorption band determined by the spacing between surface elements of the plurality of surface elements.

* * * * *